United States Patent
Kaneda

(10) Patent No.: US 8,995,154 B2
(45) Date of Patent: Mar. 31, 2015

(54) POWER SUPPLY CIRCUIT SYSTEM

(75) Inventor: Yoshinobu Kaneda, Ora-gun (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 255 days.

(21) Appl. No.: 13/416,336

(22) Filed: Mar. 9, 2012

(65) Prior Publication Data

US 2012/0230071 A1    Sep. 13, 2012

(30) Foreign Application Priority Data

Mar. 10, 2011  (JP) .................................. 2011-052910

(51) Int. Cl.
*H02M 3/07*  (2006.01)

(52) U.S. Cl.
CPC ................. *H02M 3/073* (2013.01); *H02M 3/07* (2013.01); *H02M 2003/075* (2013.01)
USPC ........................................... 363/60; 323/226

(58) Field of Classification Search
USPC ........ 363/59–60; 323/226; 327/536; 257/299
See application file for complete search history.

(56) References Cited

U.S. PATENT DOCUMENTS

| | | | |
|---|---|---|---|
| 6,980,047 B1 * | 12/2005 | Kuo | 327/537 |
| 7,224,207 B2 * | 5/2007 | Chou et al. | 327/536 |
| 7,486,128 B2 * | 2/2009 | Yen et al. | 327/536 |
| 7,973,592 B2 * | 7/2011 | Pan | 327/536 |
| 2002/0089381 A1 * | 7/2002 | Mullgrav et al. | 331/17 |
| 2008/0024198 A1 * | 1/2008 | Bitonti et al. | 327/536 |
| 2008/0111605 A1 | 5/2008 | Yoshikawa et al. | |

FOREIGN PATENT DOCUMENTS

| | | |
|---|---|---|
| JP | 2008-99370 | 4/2008 |
| JP | 2008-125267 | 5/2008 |

* cited by examiner

*Primary Examiner* — Harry Behm
(74) *Attorney, Agent, or Firm* — Robert F. Hightower

(57) ABSTRACT

A power supply circuit system includes a ring oscillator provided with a variable resistance circuit, a charge pump circuit outputting a boosted voltage in response to an oscillation output signal from the ring oscillator, a voltage regulator circuit adjusting the boosted voltage from the charge pump circuit, a first current comparator circuit comparing a first current flowing through the voltage regulator circuit with a first reference current, a second current comparator circuit comparing the first current with a second reference current, and a control circuit outputting control signals to control a resistance value of the variable resistance circuit in accordance with a first comparison signal from the first current comparator circuit and a second comparison signal from the second current comparator circuit.

12 Claims, 6 Drawing Sheets

POWER SUPPLY CIRCUIT SYSTEM

CROSS-REFERENCE OF THE INVENTION

This application claims priority from Japanese Patent Application No. 2011-052910, the content of which is incorporated herein by reference in its entirety.

BACKGROUND OF THE INVENTION

1. Field of the Invention

This invention relates to a power supply circuit system with a function to self-adjust current consumption.

2. Description of the Related Art

In a conventional power supply circuit system, a boosted voltage generated with a charge pump circuit is adjusted to a predetermined voltage with a voltage regulator circuit before being supplied to a load circuit. When the boosted voltage from the charge pump circuit reaches the predetermined voltage, an excess current from the charge pump circuit is consumed by flowing to a ground through the voltage regulator circuit in this case. Suppressing consumption of the current from the charge pump circuit substantially contributes for suppressing current consumption of an LSI as a whole, in which the power supply circuit system is incorporated.

There has been known a system which detects the boosted voltage, that is generated with the charge pump circuit and adjusted with the voltage regulator circuit, and adjusts an operating frequency or the like of the charge pump circuit when the boosted voltage reaches the predetermined voltage.

Technologies described above are disclosed in Japanese Patent Application Publication Nos. 2008-99370 and 2008-125267, for example.

However, the power supply circuit system, which detects the boosted voltage, that is generated with the charge pump circuit and adjusted with the voltage regulator circuit, and adjusts the operating frequency or the like of the charge pump circuit when the boosted voltage reaches the predetermined voltage, has a problem that there are large ripples in the output voltage (boosted voltage). In addition, the conventional power supply circuit system is not capable of keeping a stable output voltage when a loading amount to the load circuit varies abruptly.

SUMMARY OF THE INVENTION

A power supply circuit system of this invention is provided with an oscillation circuit structured to be capable of controlling an oscillation frequency and outputting an oscillation output signal, a charge pump circuit boosting an input voltage and outputting a boosted voltage in response to the oscillation output signal, a voltage regulator circuit adjusting the boosted voltage from the charge pump circuit to a predetermined voltage, and a control circuit outputting a control signal controlling the oscillation circuit so that the oscillation frequency of the oscillation circuit is increased when a first current flowing through the voltage regulator circuit is smaller than a first reference current, the oscillation frequency of the oscillation circuit is decreased when the first current is larger than a second reference current, and the oscillation frequency of the oscillation circuit is maintained when the first current is between the first reference current and the second reference current, the second reference current being larger than the first reference current.

DETAILED DESCRIPTION OF THE INVENTION

Figure 1:
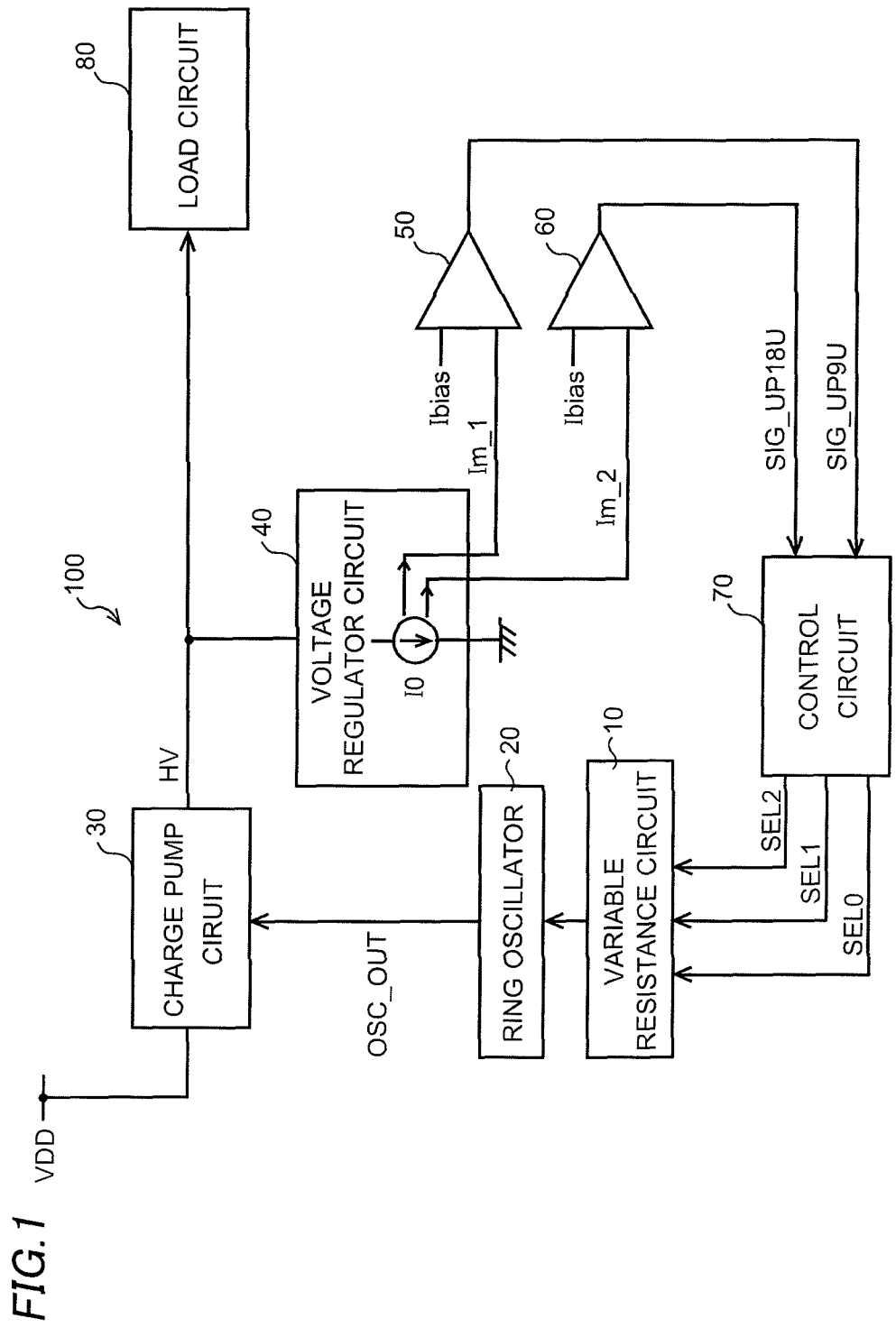
FIG. 1 is a block diagram showing a whole structure of a power supply circuit system 100 according to an embodiment of this invention.

FIG. 1 is a block diagram showing the whole structure of a power supply circuit system 100 according to an embodiment of this invention.

The power supply circuit system 100 is formed to include a ring oscillator 20 (an example of "oscillation circuit") provided with a variable resistance circuit 10, a charge pump circuit 30 boosting an input voltage VDD and outputting a boosted voltage HV in response to an oscillation output signal OSC_OUT from the ring oscillator 20, a voltage regulator circuit 40 adjusting the boosted voltage HV from the charge pump circuit 30 to a predetermined voltage, a first current comparator circuit 50 comparing a first current I0 flowing through the voltage regulator circuit 40 with a predetermined first reference current, a second current comparator circuit 60 comparing the first current I0 flowing through the voltage regulator circuit 40 with a predetermined second reference current, and a control circuit 70 outputting three bits of control signals (SEL2, SEL1, SEL0) for controlling a resistance value of the variable resistance circuit 10 in accordance with a first comparison signal SIG_UP9U from the first current comparator circuit 50 and a second comparison signal SIG_UP18U from the second current comparator circuit 60. The boosted voltage HV that is adjusted with the voltage regulator circuit 40 is applied to a load circuit 80.

That is, the power supply circuit system 100 detects the first current I0 consumed in the voltage regulator circuit 40 with the first and second current comparator circuits 50 and 60. The control circuit 70 controls the ring oscillator 20 so that an oscillation frequency of the ring oscillator 20 is increased when the first current I0 flowing through the voltage regulator circuit 40 is smaller than the first reference current, the oscillation frequency of the ring oscillator 20 is decreased when the first current I0 is larger than the second reference current, and the oscillation frequency of the ring oscillator 20 is maintained when the first current I0 is between the first reference current and the second reference current.

Figure 2:
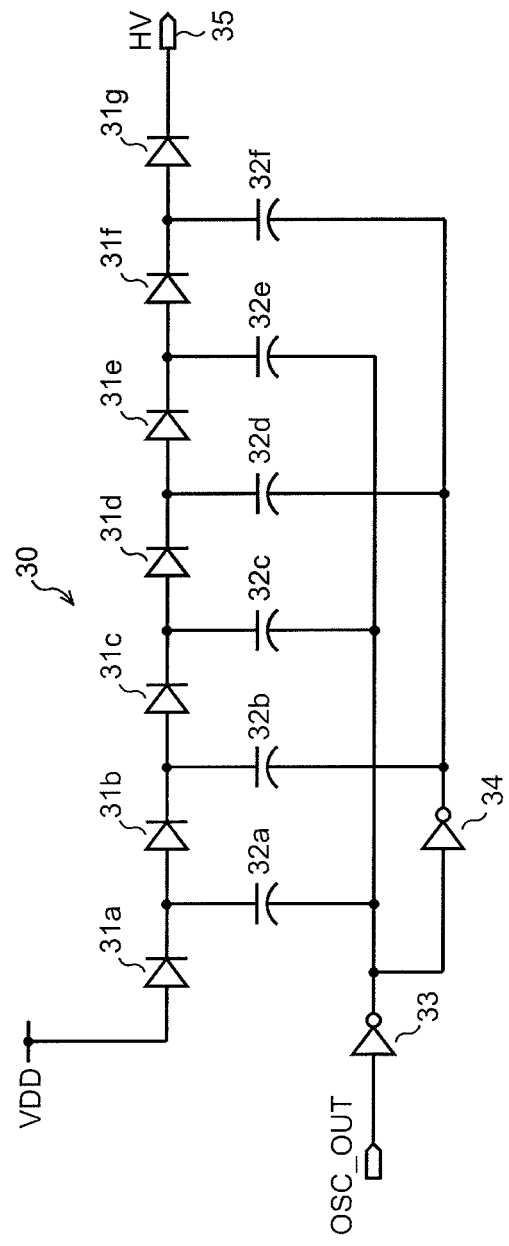
FIG. 2 is a circuit diagram of a charge pump circuit 30.

Structures of the circuits composing the power supply circuit system 100 are described FIG. 2 is a circuit diagram of the charge pump circuit 30. The charge pump circuit 30 boosts the input voltage VDD and outputs the boosted voltage HV, and is formed to include seven diodes 31a-31g (an example of "charge transfer devices") connected in series in the same direction and six capacitors 32a-32f. A first terminal of each of the capacitors 32a-32f is connected to each of connecting nodes between the diodes 31a-31g, respectively. The power supply voltage VDD is applied to an anode of the diode 31a in a first stage.

The oscillation output signal OSC_OUT is applied to a second terminal of each of the capacitors 32a, 32c and 32e through an inverter 33. The oscillation output signal OSC_OUT is applied to a second terminal of each of the capacitors 32b, 32d and 32f through two inverters 33 and 34. That is, a clock signal in a reversed phase with the oscillation output signal OSC_OUT is applied to the capacitors 32a, 32c and 32e, while a clock signal in phase with the oscillation output signal OSC_OUT is applied to the capacitors 32b, 32d and 32f.

The oscillation output signal OSC_OUT is a clock signal alternating between an H level that is the power supply voltage VDD and an L level that is a ground voltage (0V). Looking at the first stage of the charge pump circuit 30, the second terminal of the capacitor 32a in the first stage is at the L level when the oscillation output signal OSC_OUT is at the H level. The first terminal of the capacitor 32a in the first stage is charged to VDD−Vt with electric charges transferred through the diode 31a in the first stage. Here, Vt represents a forward threshold voltage of each of the diodes 31a-31g.

When the oscillation output signal OSC_OUT turns from the H level to the L level, the second terminal of the capacitor 32a in the first stage turns from the L level to the H level. As a result, the first terminal of the capacitor 32a in the first stage turns from VDD−Vt to VDD−Vt+VDD, that is, 2VDD−Vt. At the same time, the second terminal of the capacitor 32b in the second stage turns to the L level. Then, electric charges are transferred to the capacitor 32b in the second stage through the diode 31b in the second stage to charge the first terminal of the capacitor 32b in the second stage to 2VDD−Vt−Vt, that is, 2(VDD−Vt). At that time, the diode 31a in the first stage is turned off due to a reverse bias which prevents a backflow of the electric charges.

Electric charges are transferred from the first stage to the succeeding stages in the charge pump circuit 30 in response to the oscillation output signal OSC_OUT as described above, and the voltage is successively boosted in each of the stages. Thus, the boosted voltage HV that is 7(VDD−Vt) is outputted from an output terminal 35 that is a cathode of the diode 31g in the final stage. The boosted voltage HV is adjusted to the predetermined voltage with the voltage regulator circuit 40. It is noted that the number of the stages in the charge pump circuit 30 may be modified corresponding to a voltage required in the load circuit 80. Also, the diodes 31a-31g may be formed of switching devices such as MOS transistors.

The current consumption of the charge pump circuit 30 increases as the oscillation frequency of the ring oscillator 20, that is, the frequency of the oscillation output signal OSC_OUT increases, because a charge transfer rate in the charge pump circuit 30 is increased. On the other hand, the current consumption of the charge pump circuit 30 decreases as the frequency of the oscillation output signal OSC_OUT decreases, because the charge transfer rate in the charge pump circuit 30 is reduced. Therefore, the current consumption of the charge pump circuit 30 can be controlled by controlling the oscillation frequency of the ring oscillator 20.

Figure 3:
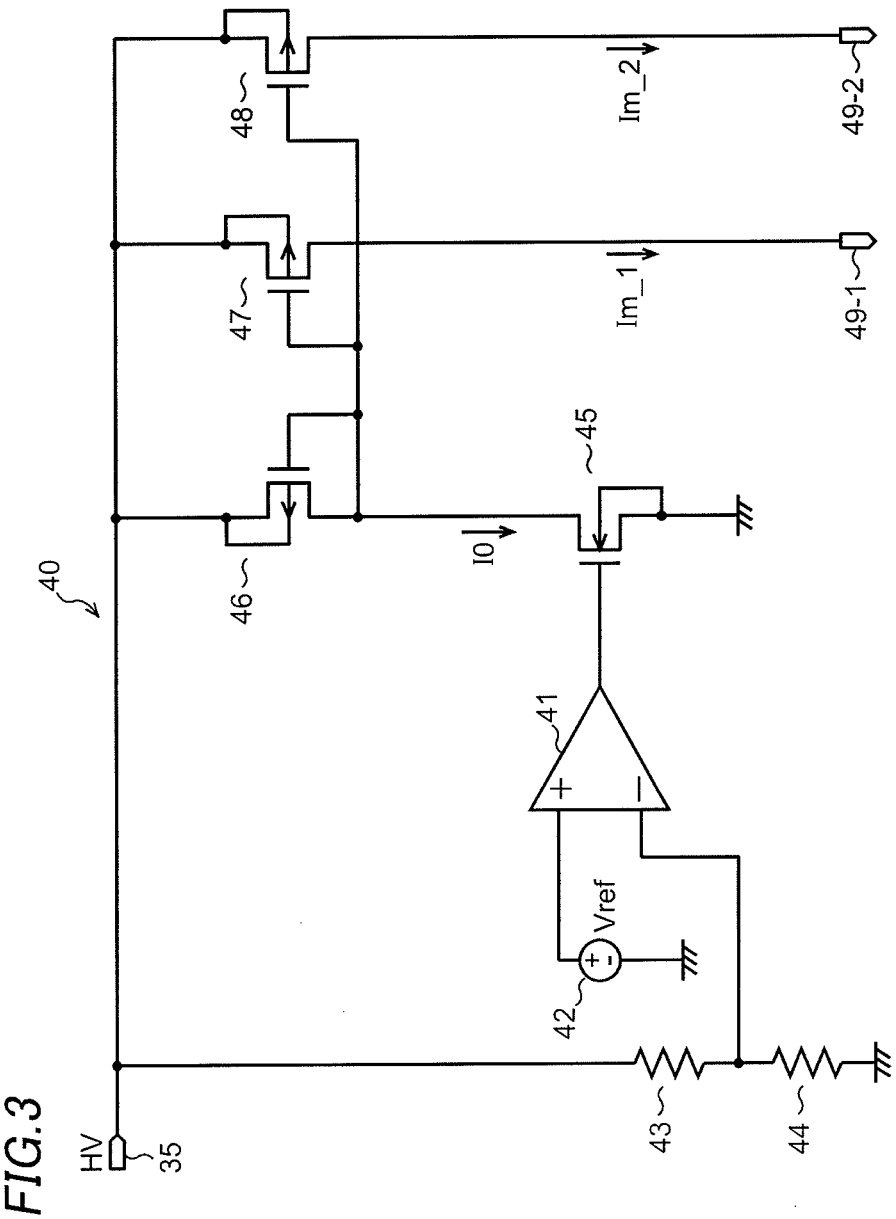
FIG. 3 is a circuit diagram of a voltage regulator circuit 40.

FIG. 3 is a circuit diagram of the voltage regulator circuit 40. The voltage regulator circuit 40 adjusts the boosted voltage HV from the charge pump circuit 30 to an arbitrary voltage level. A reference voltage VREF (1.2V, for example) is applied to a first input terminal (+) of an operational amplifier 41 through a reference voltage source 42. A resistor 43 and a resistor 44 are connected in series between the output terminal 35 of the charge pump circuit 30 and the ground. A voltage at a connecting node between the resistor 43 and the resistor 44 is applied to a second input terminal (−) of the operational amplifier 41.

An output voltage of the operational amplifier 41 is applied to a gate of an N channel type MOS transistor 45. The N channel type MOS transistor 45 and a P channel type MOS transistor 46 are connected in series between the output terminal 35 of the charge pump circuit 30 and the ground. A source of the P channel type MOS transistor 46 is connected to the output terminal 35 of the charge pump circuit 30, and its gate and drain are connected with each other. A drain of the N channel type MOS transistor 45 is connected with the drain of the P channel type MOS transistor 46, and its source is grounded.

The first current I0 flows through the N channel type MOS transistor 45 and the P channel type MOS transistor 46. As a result, the voltage at the second input terminal (−) of the operational amplifier 41 becomes equal to the reference voltage VREF applied to the first input terminal (+), because negative feedback works on the operational amplifier 41.

Since the boosted voltage HV from the charge pump circuit 30 is represented by a following equation (1) where R_H0 denotes a resistance value of the resistor 43 and R_H1 denotes a resistance value of the resistor 44, the level of the boosted voltage HV from the charge pump circuit 30 can be adjusted arbitrarily by adjusting the two resistance values R_H0 and R_H1.

$$HV = VREF \times (R\_H0 + R\_H1)/R\_H1 \qquad (1)$$

When R_H0=75KΩ, R_H1=10KΩ, and VREF=1.2V, for example, HV=1.2V×(75KΩ+10KΩ)/10KΩ=10.2V.

There are provided P channel type MOS transistors 46, 47 and 48 in order to detect the first current I0 flowing through the voltage regulator circuit 40. The P channel type MOS transistor 46 and the P channel type MOS transistor 47 form a current mirror.

That is, a source of the P channel type MOS transistor 47 is connected with the output terminal 35 of the charge pump circuit 30 while its gate is connected with the gate of the P channel type MOS transistor 46. The P channel type MOS transistor 46 and the P channel type MOS transistor 48 form a current mirror. That is, a source of the P channel type MOS transistor 48 is connected with the output terminal 35 of the charge pump circuit 30 while its gate is connected with the gate of the P channel type MOS transistor 46.

In this case, gate widths GW0, GW1 and GW2 of the P channel type MOS transistors 46, 47 and 48, respectively, are set to satisfy an inequality GW0☐GW1☐GW2. Gate length GL of each of the P channel MOS transistors 46, 47 and 48 is set to be equal to each other.

When GW0=10 μm, GW1=2 μm, GW2=1 μm, for example, and Im_1 denotes a second current outputted from an output terminal 49-1 that is connected to a drain of the P channel type MOS transistor 47 and Im_2 denotes a third current outputted from an output terminal 49-2 that is connected to a drain of the P channel type MOS transistor 48, the second current Im_1 is represented as Im_1=I0×2/10, and the third current Im_2 is represented as Im_2=I0×1/10, using the first current I0. Current consumption is suppressed by setting the second current Im_1 and the third current Im_2 smaller than the first current I0.

Figure 4:
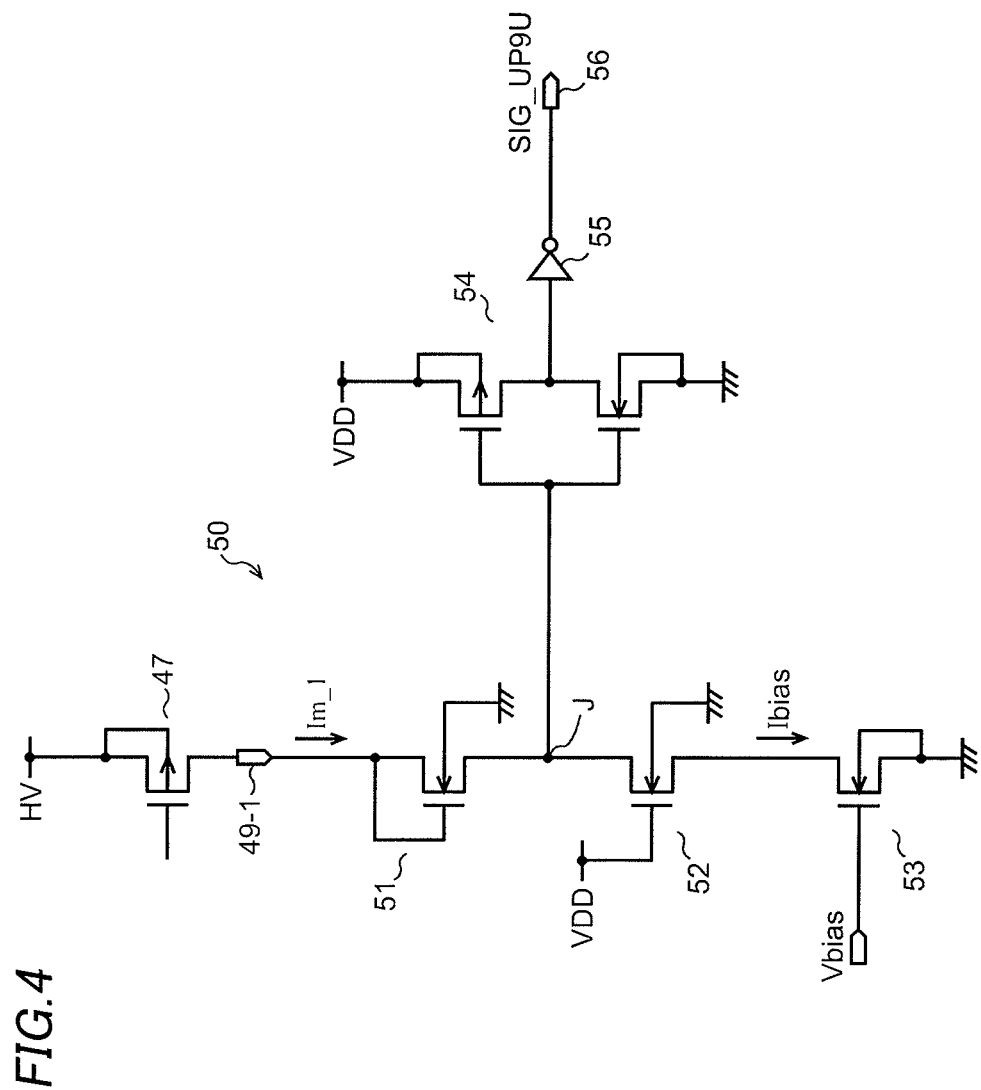
FIG. 4 is a circuit diagram of a first current comparator circuit 50.

FIG. 4 is a circuit diagram of the first current comparator circuit 50. The first current comparator circuit 50 compares the second current Im_1 outputted from the P channel type MOS transistor 47 with a constant current Ibias. The P channel type MOS transistor 47 outputting the second current Im_1, N channel type MOS transistors 51 and 52 and an N channel type MOS transistor 53 generating a bias current Ibias that makes the constant current Ibias are connected in series in the order mentioned above. A bias voltage Vbias is applied to a gate of the N channel type MOS transistor 53, and its source is grounded.

A connecting node J between the N channel type MOS transistors 51 and 52 is connected with an input terminal of an inverter 54 to which the power supply voltage VDD is provided. An output signal of the inverter 54 is outputted from an output terminal 56 through an inverter 55 to which the power supply voltage VDD is provided. The first comparison signal SIG_UP9U is obtained from the output terminal 56.

The second current Im_1 outputted from the P channel type MOS transistor 47 flows into the connecting node J through the N channel type MOS transistor 51. Therefore, an electric potential at the node J rises when $Im_{\_1}$>Ibias. The electric potential at the node J falls when $Im_{\_1}$<Ibias. As a result, a logical value of the first comparison signal SIG_UP9U becomes "1" (VDD level) when Im_1>Ibias, and the logical value of the first comparison signal SIG_UP9U becomes "0" when Im_1<Ibias.

The second current comparator circuit 60 is structured in the same way as the first current comparator circuit 50, and compares the third current Im_2 outputted from the P channel type MOS transistor 48 with the constant current Ibias. The second comparison signal SIG_UP18U is obtained from its output terminal. Thus, a logical value of the second comparison signal SIG_UP18U becomes "1" (VDD level) when Im_2>Ibias, and the logical value of the second comparison signal SIG_UP18U becomes "0" when Im_2<Ibias.

When Ibias is set to 1.8 μA (Ibias=1.8 μA) and the gate widths of the P channel type MOS transistors 46, 47 and 48 are set so that GW0=10 μm, GW1=2 μm and GW2=1 μm, for example, the second and third current Im_2 and Im_3 are represented as $Im_{\_1}$=I0×2/10 and Im_2=I0×1/10, respectively.

Thus, it is understood that the inequality Im_1>Ibias holds when I0□9.0 μA. Also, it is understood that the inequality $Im_{\_2}$>Ibias holds when I0□18.0 μA. The first comparison signal SIG_UP9U is "1" when I0□9.0 μA, while the second comparison signal SIG_UP18U is "1" when I0□018.0 μA, as shown in Table 1. Therefore, a current range of the first current I0 flowing through the voltage regulator circuit 40 can be detected based on the first comparison signal SIG_UP9U and the second comparison signal SIG_UP18U.

TABLE 1

| I0 | <9.0 μA | 9.0 μA-18.0 μA | 18.0 μA< |
|---|---|---|---|
| SIG_UP9U | 0 | 1 | 1 |
| SIG_UP18U | 0 | 0 | 1 |

A circuit structure that detects the first current I0 by comparing the first current I0 flowing through the voltage regulator circuit 40 directly with two reference currents (9.0 μA and 18.0 μA, for example) is also possible. However, it has a problem that the current consumption is increased.

The control circuit 70 outputs the three bits of control signals (SEL2, SEL1, SEL0) to control the resistance value of the variable resistance circuit 10 in accordance with the first comparison signal SIG_UP9U from the first current comparator circuit 50 and the second comparison signal SIG_UP18U from the second current comparator circuit 60, as shown in FIG. 1. By doing so, the control circuit 70 controls the operating frequency of the charge pump circuit 30, that is, the frequency of the oscillation output signal OSC_OUT supplied to the charge pump circuit 30 so that the first current I0 consumed in the voltage regulator circuit 40 is contained in a predetermined allowable current range (9.0 μA-18.0 μA, for example).

To be more specific, the resistance value of the variable resistance circuit 10 that determines the oscillation frequency of the ring oscillator 20 is adjusted in accordance with the three bits of the control signals (SEL2, SEL1, SEL0). The variable resistance circuit 10 is structured so that its resistance value increases as a digital value of the control signals (SEL2, SEL1 and SEL0) increases. The ring oscillator 20 is structured so that the oscillation frequency is reduced as the resistance value of the variable resistance circuit 10 increases. The number of the bits of the control signals may be increased or decreased as appropriate.

The control circuit 70 controls the ring oscillator 20 so that the oscillation frequency of the ring oscillator 20 is increased by reducing the resistance value of the variable resistance circuit 10 when the first current I0 consumed in the voltage regulator circuit 40 is smaller than 9.0 μA, as shown in Table 2. Also, the control circuit 70 controls the ring oscillator 20 so that the oscillation frequency of the ring oscillator 20 is reduced by increasing the resistance value of the variable resistance circuit 10 when the first current I0 is larger than 18.0 μA. The control circuit 70 controls the ring oscillator 20 so that the oscillation frequency of the ring oscillator 20 is maintained as it is when the first current I0 is larger than 9.0 μA and smaller than 18.0 μA.

TABLE 2

| I0 | <9.0 μA | 9.0 μA-18.0 μA | 18.0 μA< |
|---|---|---|---|
| SIG_UP9U | 0 | 1 | 1 |
| SIG_UP18U | 0 | 0 | 1 |
| Down | 0 | 0 | 1 |
| Stay | 0 | 1 | 0 |
| Up | 1 | 0 | 0 |

For example, when the first current I0 is larger than the allowable current (18.0 μA, for example) in a state where the control signals are (SEL2, SEL1, SEL0)=(1, 0, 0), the control signals are modified to (SEL2, SEL1, SEL0)=(1, 0, 1) to reduce the operating frequency of the charge pump circuit 30 by one step. The detection of the first current I0 is periodically repeated. When the first current is still larger than the allowable current, the control signals are modified to (SEL2, SEL1, SEL0)=(1, 1, 0) to further reduce the operating frequency of the charge pump circuit 30 by one more step.

Then, when the first current I0 is smaller than the allowable current (9.0 μA, for example) in the state where the control signals are (SEL2, SEL1, SEL0)=(1, 1, 0), the control signals are resumed to (SEL2, SELL, SEL0)=(1, 0, 1) to increase the operating frequency of the charge pump circuit 30 by one step. By periodically repeating the control as described above, an average value of the first current I0 automatically settles down to the allowable current range (9.0 μA-18.0 μA). The control circuit 70 is a microcomputer, for example.

Figure 5:
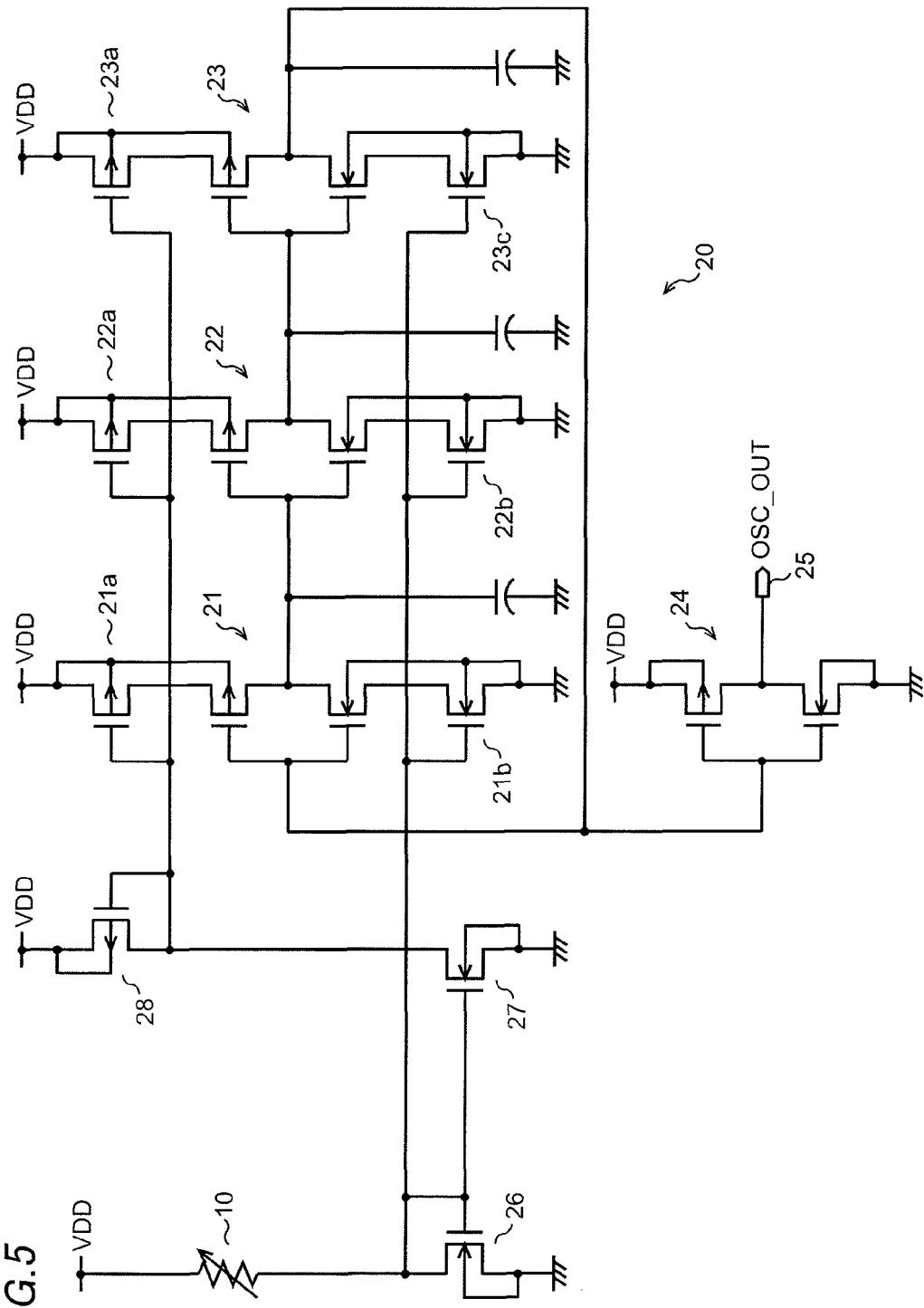
FIG. 5 is a circuit diagram of a ring oscillator 20.

FIG. 5 is a circuit diagram of the ring oscillator 20. Three stages of CMOS inverters 21, 22 and 23, to which the power supply voltage VDD is provided, are connected in series. An output of the CMOS inverter 23 in the third stage is fed back to the CMOS inverter 21 in the first stage. The output of the CMOS inverter 23 in the third stage is inputted to a CMOS inverter 24 that constitutes a buffer. The oscillation output signal OSC_OUT is obtained from an output terminal 25 of the CMOS inverter 24. The oscillation output signal OSC_OUT is the clock signal alternating between the H level that is the power supply voltage VDD and the L level that is the ground voltage (0V).

The ring oscillator 20 is structured as described below so that the oscillation frequency is made variable in accordance with the controls signals (SEL2, SELL, SEL0) outputted from the control circuit 70. Each of P channel type MOS transistors 21a, 22a and 23a that make current sources is connected to a power supply side of each of the CMOS inverters 21, 22 and 23, respectively. Also, each of N channel type MOS transistors 21b, 22b and 23b that make current sources is connected to a ground side of each of the CMOS inverters 21, 22 and 23, respectively.

The variable resistance circuit 10 and an N channel type MOS transistor 26 that makes a current source are connected in series between the power supply voltage VDD and the ground. As a result, when the resistance value of the variable resistance circuit 10 varies, an amount of current flowing through the N channel type MOS transistor 26 varies accordingly. A gate and a drain of the N channel type MOS transistor 26 are connected with each other and its source is grounded.

The N channel type MOS transistor 26 and each of the N channel type MOS transistors 21b, 22b and 23b connected to each of the CMOS inverters 21, 22 and 23 form a current mirror, respectively. Also, the N channel type MOS transistor 26 and an N channel type MOS transistor 27 form a current mirror. The N channel type MOS transistor 27 is connected in series with a P channel type MOS transistor 28. The P channel type MOS transistor 28 and each of the P channel type MOS transistors 21a, 22a and 23a form a current mirror, respectively.

As a result, when the resistance value of the variable resistance circuit 10 varies, a current flowing through each of the CMOS inverters 21, 22 and 23 varies accordingly to modify the oscillation frequency. That is, the current flowing through each of the CMOS inverters 21, 22 and 23 is reduced to decrease the oscillation frequency when the resistance value of the variable resistance circuit 10 is increased, and the current flowing through each of the CMOS inverters 21, 22 and 23 is increased to increase the oscillation frequency when the resistance value of the variable resistance circuit 10 is reduced, on the other hand.

Figure 6:
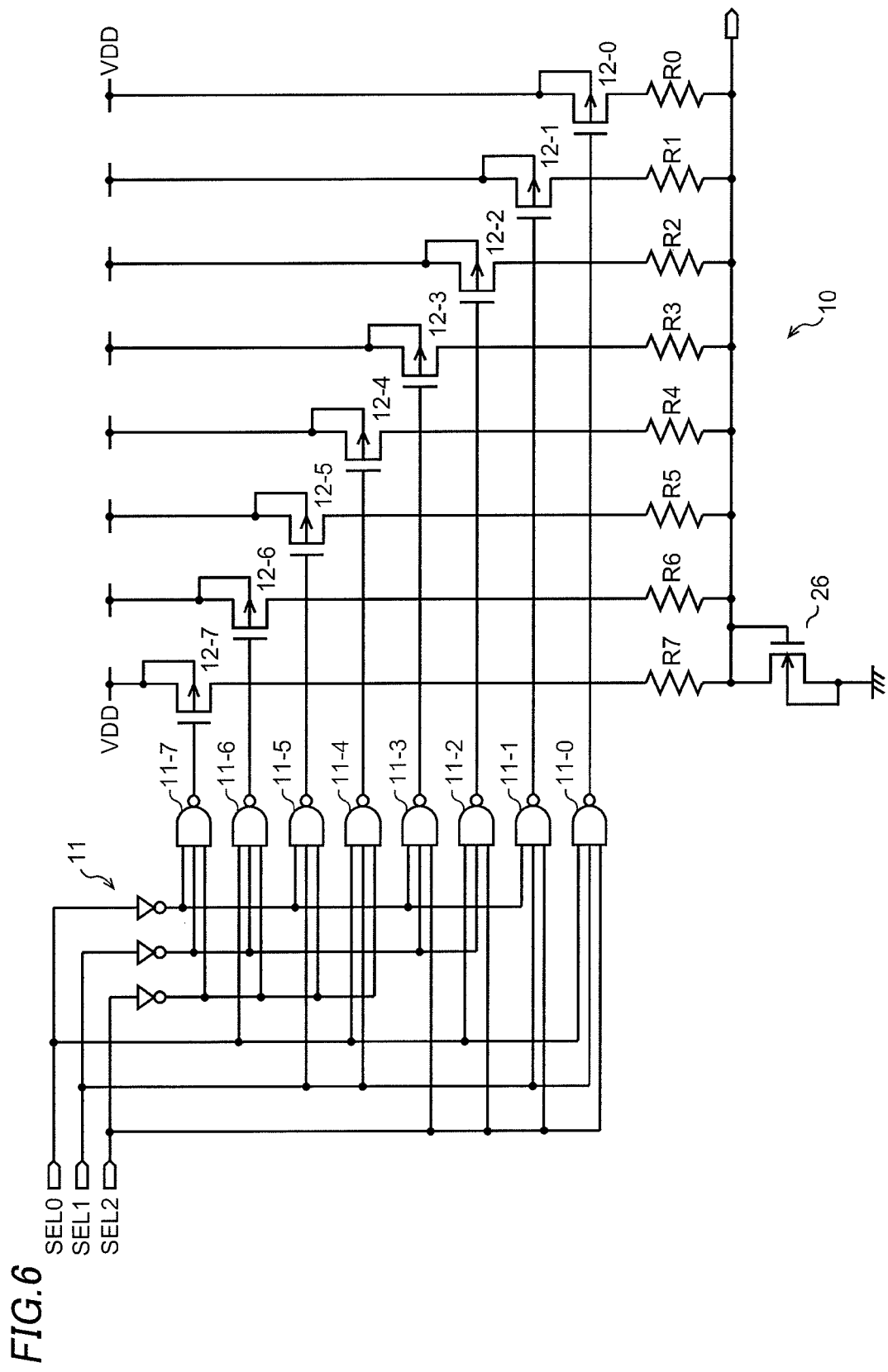
FIG. 6 is a circuit diagram of a variable resistance circuit 10.

FIG. 6 is a circuit diagram of the variable resistance circuit 10. The variable resistance circuit 10 is structured so that the resistance value is made controllable in accordance with the control signals (SEL2, SEL1, SEL0) outputted from the control circuit 70. One end of each of eight resistors R0-R7 is connected to the N channel type MOS transistor 26, while each of eight P channel type selection transistors 12-0-12-7 is connected between another end of each of the resistors R0-R7 and the power supply voltage VDD, respectively. The resistors R0-R7 have resistance values that differ from each other as shown in Table 3, for example.

TABLE 3

| SEL2 | SEL1 | SEL0 | Selected Resistor | Selected Resistance |
|---|---|---|---|---|
| 0 | 0 | 0 | R0 | 100 KΩ |
| 0 | 0 | 1 | R1 | 110 KΩ |
| 0 | 1 | 0 | R2 | 120 KΩ |
| 0 | 1 | 1 | R3 | 130 KΩ |
| 1 | 0 | 0 | R4 | 140 KΩ |
| 1 | 0 | 1 | R5 | 150 KΩ |
| 1 | 1 | 0 | R6 | 160 KΩ |
| 1 | 1 | 1 | R7 | 170 KΩ |

There is provided a selection circuit 11 that turns on one of the selection transistors 12-0-12-7 in accordance with the control signals (SEL2, SEL1, SEL0). The selection circuit 11 is formed to include three-input NAND circuits 11-0-11-7. An output of each of the NAND circuits 11-0-11-7 is applied to a gate of each of the selection transistors 12-0-12-7, respectively.

The resistor R0 (resistance value 100KΩ) is selected when (SEL2, SEL1, SEL0)=(0, 0, 0), and the resistor R1 (resistance value 110KΩ) is selected when (SEL2, SEL1, SEL0)=(0, 0, 1), as shown in Table 3. As a result, the resistance value of the variable resistance circuit 10 can be varied in eight steps, and the oscillation frequency of the ring oscillator 20 also can be varied in eight steps accordingly.

It is possible that the oscillation frequency of the ring oscillator 20 is varied in more steps by increasing the number of the resistors in accordance with the number of the bits of the control signals. It is also possible that a different type of oscillator such as an RC oscillator is used instead of the ring oscillator 20.

With the power supply circuit system 100, the current consumed in the charge pump circuit 30 can be suppressed to the minimum amount required to obtain the boosted voltage HV to drive the load circuit 80 by detecting the first current I0 flowing through the voltage regulator circuit 40 and controlling the operating frequency of the charge pump circuit 30 based on the result of the detection, as described above.

It is also made possible that the ripples in the boosted voltage HV generated with the charge pump circuit 30 and adjusted with the regulator circuit 40 are suppressed while the stable boosted voltage HV (output voltage) is maintained even when the loading amount to the load circuit 80 varies abruptly, since there is adopted a method to detect the first current I0 in the voltage regulator circuit 40 so as to perform the feedback control.

The power supply circuit system 100 according to the embodiment of this invention can be incorporated in various kinds of LSIs, and is especially appropriate as a power supply circuit system for an EEPROM. In the EEPROM, it is necessary to provide a bit line, a word line and a source line with predetermined voltages in accordance with each of operation modes such as erasing, programming and reading of data in memory cells. In this case, the current consumption of the charge pump circuit 30 occupies most (about 80%) of current consumption of the EEPROM as a whole.

With the power supply circuit system 100 according to the embodiment, it is made possible to provide the bit line or the like with the boosted voltage HV adjusted by the voltage regulator circuit 40, which is varied in accordance with each of the operation modes. At that time, the current consumption of the charge pump circuit 30 can be suppressed to the minimum amount required in each of the operation modes.

With the power supply circuit system of this invention, the current consumption of the charge pump circuit can be suppressed to the minimum amount required to obtain the predetermined voltage. Also, it is made possible that the ripples in the output voltage are suppressed while the stable output voltage is maintained even when the loading amount to the load circuit varies abruptly.

What is claimed is:

1. A power supply circuit system comprising:
   an oscillation circuit configured to change an oscillation frequency thereof and outputting an oscillation output signal;
   a charge pump circuit outputting a boosted voltage in response to the oscillation output signal, the boosted voltage being obtained by boosting an input voltage;
   a voltage regulator circuit adjusting the boosted voltage from the charge pump circuit to a predetermined voltage;
   a control circuit outputting a control signal controlling the oscillation circuit so that the oscillation frequency of the oscillation circuit is increased when a first current flowing through the voltage regulator circuit is smaller than a first reference current, the oscillation frequency of the oscillation circuit is decreased when the first current is larger than a second reference current, and the oscillation frequency of the oscillation circuit is maintained when the first current is between the first reference current and the second reference current, the second reference current being larger than the first reference current; and the voltage regulator circuit including an operational amplifier and a first transistor, a reference voltage being applied to a first input terminal of the operational amplifier and a voltage corresponding to the boosted voltage being applied to a second input terminal of the operational amplifier, the first transistor being controlled by an output of the operational amplifier, and the first current flowing through the first transistor.

2. The power supply circuit system of claim 1, wherein the charge pump circuit comprises a charge transfer device and a capacitor, the input voltage being applied to the charge transfer device, one end of the capacitor being connected to the charge transfer device and the oscillation output signal being applied to the other end of the capacitor, wherein the charge pump circuit boosts the input voltage and outputs the boosted voltage by transferring electric charges from the charge transfer device in response to the oscillation output signal.

3. The power supply circuit system of claim 1, wherein the oscillation circuit is a ring oscillator comprising a variable resistance circuit varying a resistance value thereof in accordance with the control signal and operating in accordance with a current flowing through the variable resistance circuit.

4. The power supply circuit system of claim 3, wherein the variable resistance circuit comprises a plurality of resistors and a selection circuit that selects one of the resistors out of the plurality of resistors in accordance with the control signal.

5. The power supply circuit system of claim 1 further including a variable resistance circuit having a resistance value that varies in response to the control signal wherein the oscillation frequency of the oscillation circuit varies in response to a change in the resistance value of the variable resistance circuit.

6. A power supply circuit system comprising:
an oscillation circuit configured to change an oscillation frequency thereof and outputting an oscillation output signal;
a charge pump circuit outputting a boosted voltage in response to the oscillation output signal, the boosted voltage being obtained by boosting an input voltage;
a voltage regulator circuit comprising an operational amplifier and a first transistor and adjusting the boosted voltage from the charge pump circuit to a predetermined voltage, a reference voltage being applied to a first input terminal of the operational amplifier and a voltage corresponding to the boosted voltage being applied to a second input terminal of the operational amplifier, the first transistor being controlled by an output voltage of the operational amplifier, and a first current flowing through the first transistor;
a second transistor connected between the first transistor and an output terminal of the charge pump circuit;
a third transistor forming a current mirror together with the second transistor and outputting a second current, the second current being proportional to the first current and smaller than the first current;
a fourth transistor forming a current mirror together with the second transistor and outputting a third current, the third current being proportional to the first current and smaller than the second current;
a first current comparator circuit comparing the second current with a constant current;
a second current comparator circuit comparing the third current with the constant current; and a control circuit outputting a control signal controlling the oscillation circuit so that the oscillation frequency of the oscillation circuit is increased when the second current is smaller than the constant current, the oscillation frequency of the oscillation circuit is decreased when the third current is larger than the constant current, and the oscillation frequency of the oscillation circuit is maintained when the second current is larger than the constant current and the third current is smaller than the constant current.

7. The power supply circuit system of claim 6, wherein the charge pump circuit comprises a charge transfer device and a capacitor, the input voltage being applied to the charge transfer device, one end of the capacitor being connected to the charge transfer device and the oscillation output signal being applied to the other end of the capacitor, wherein the charge pump circuit boosts the input voltage and outputs the boosted voltage by transferring electric charges from the charge transfer device in response to the oscillation output signal.

8. The power supply circuit system of claim 6, wherein the first current comparator circuit comprises a first current source and a first inverter, the first current source being connected in series with the third transistor and providing the constant current, a voltage at a connecting node between the third transistor and the first current source being applied to the first inverter, and wherein the second current comparator circuit comprises a second current source and a second inverter, the second current source being connected in series with the fourth transistor and providing the constant current, a voltage at a connecting node between the fourth transistor and the second current source being applied to the second inverter.

9. A power supply circuit comprising:
an oscillation circuit configured to change an oscillation frequency thereof and configured to output an oscillation output signal;
a charge pump circuit configured to output a boosted voltage in response to the oscillation output signal, the boosted voltage being obtained by boosting an input voltage;
a voltage regulator circuit configured to control the boosted voltage from the charge pump circuit to a predetermined voltage, the voltage regulator configured to form a first current from the boosted voltage;
a control circuit configured to output a control signal to control the oscillation circuit so that the oscillation frequency of the oscillation circuit increases responsively to a first value of the first current, the oscillation frequency decreases responsively to a second value of the first current, and the oscillation frequency of the oscillation circuit is maintained when the first current is between the first value and the second value; and
the voltage regulator circuit including a first transistor configured to conduct the first current and having a control electrode coupled to receive a voltage that is proportional to a value of the boosted voltage.

10. The power supply circuit of claim 9 wherein the first value of the first current is smaller than the second value of the first current.

11. The power supply circuit of claim 9 further including a comparator coupled to receive a signal that is representative of the boosted voltage and form the voltage to control the first transistor.

12. The power supply circuit system of claim 9 wherein the first current is an analog current.

* * * * *